United States Patent
Azadet et al.

(10) Patent No.: US 10,209,987 B2
(45) Date of Patent: Feb. 19, 2019

(54) DIRECT DIGITAL SYNTHESIS OF SIGNALS USING MAXIMUM LIKELIHOOD BIT-STREAM ENCODING

(71) Applicant: Intel Corporation, Santa Clara, CA (US)

(72) Inventors: Kameran Azadet, Pasadena, CA (US); Steven C. Pinault, Allentown, PA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/495,635

(22) Filed: Apr. 24, 2017

(65) Prior Publication Data

US 2017/0293485 A1 Oct. 12, 2017

Related U.S. Application Data

(63) Continuation of application No. 14/944,184, filed on Nov. 17, 2015, now Pat. No. 9,632,750, which is a (Continued)

(51) Int. Cl.
G06F 9/30 (2018.01)
G06F 17/15 (2006.01)
(Continued)

(52) U.S. Cl.
CPC ............. G06F 9/3001 (2013.01); G06F 5/01 (2013.01); G06F 9/30036 (2013.01);
(Continued)

(58) Field of Classification Search
CPC ......... H04L 1/0054; H04L 25/02; G06F 5/01; G06F 9/30036; H03F 1/0288; H03F 1/3241; H03F 3/24; H04B 1/0475; H04B 1/62
(Continued)

(56) References Cited

U.S. PATENT DOCUMENTS 3,506,918 A * 4/1970 Perreault ........... H04L 25/03006
327/100
3,946,214 A * 3/1976 Stuart ..................... H03H 17/06
333/18
(Continued)

OTHER PUBLICATIONS

International Preliminary Report on Patentability for PCT Patent Application No. PCT/US12/62175, dated Apr. 29, 2014.
(Continued)

*Primary Examiner* — Emmanuel Bayard
(74) *Attorney, Agent, or Firm* — Green, Howard & Mughal LLP

(57) ABSTRACT

Maximum likelihood bit-stream generation and detection techniques are provided using the M-algorithm and Infinite Impulse Response (IIR) filtering. The M-Algorithm is applied to a target input signal X to perform Maximum Likelihood Sequence Estimation on the target input signal X to produce a digital bit stream B, such that after filtering by an IIR filter, the produced digital stream Y produces an error signal satisfying one or more predefined requirements. The predefined requirements comprise, for example, a substantially minimum error. In an exemplary bit detection implementation, the target input signal X comprises an observed analog signal and the produced digital stream Y comprises a digitized output of a receive channel corresponding to a transmitted bit stream. In an exemplary bit stream generation implementation, the target input signal X comprises a desired transmit signal and the produced digital stream Y comprises an estimate of the desired transmit signal.

14 Claims, 8 Drawing Sheets

Related U.S. Application Data continuation of application No. 14/090,555, filed on Nov. 26, 2013, now Pat. No. 9,201,628, which is a continuation-in-part of application No. PCT/US2012/062175, filed on Oct. 26, 2012.

(60) Provisional application No. 61/552,242, filed on Oct. 27, 2011.

(51) Int. Cl.

| | | |
|---|---|---|
| *H03H 17/06* | (2006.01) | |
| *H04B 1/04* | (2006.01) | |
| *H04L 1/00* | (2006.01) | |
| *H04L 27/233* | (2006.01) | |
| *H04B 1/62* | (2006.01) | |
| *H04L 25/02* | (2006.01) | |
| *H04L 25/03* | (2006.01) | |
| *G06F 5/01* | (2006.01) | |
| *H03M 3/00* | (2006.01) | |
| *H03F 1/02* | (2006.01) | |
| *H03F 1/32* | (2006.01) | |
| *H03F 3/189* | (2006.01) | |
| *H03F 3/24* | (2006.01) | |
| *H04L 25/49* | (2006.01) | |
| *H04B 1/00* | (2006.01) | |

(52) U.S. Cl.
CPC ........... *G06F 17/15* (2013.01); *H03F 1/0288* (2013.01); *H03F 1/3241* (2013.01); *H03F 1/3258* (2013.01); *H03F 3/189* (2013.01); *H03F 3/24* (2013.01); *H03H 17/06* (2013.01); *H03M 3/30* (2013.01); *H04B 1/0475* (2013.01); *H04B 1/62* (2013.01); *H04L 1/0054* (2013.01); *H04L 25/02* (2013.01); *H04L 25/03* (2013.01); *H04L 25/03178* (2013.01); *H04L 25/03216* (2013.01); *H04L 25/4917* (2013.01); *H04L 27/2334* (2013.01); *H03F 2200/336* (2013.01); *H03F 2201/3209* (2013.01); *H03F 2201/3212* (2013.01); *H03F 2201/3224* (2013.01); *H03F 2201/3233* (2013.01); *H04B 1/0003* (2013.01); *H04B 2001/0408* (2013.01)

(58) Field of Classification Search
USPC .................................. 375/229–233, 341, 350
See application file for complete search history.

(56) References Cited

U.S. PATENT DOCUMENTS

| | | | | |
|---|---|---|---|---|
| 5,031,195 | A * | 7/1991 | Chevillat | H03H 21/0018 375/234 |
| 5,416,845 | A | 5/1995 | Shen | |
| 5,442,353 | A * | 8/1995 | Jackson | H03M 3/402 341/143 |
| 5,450,083 | A * | 9/1995 | Brewer | H03H 17/0664 341/143 |
| 5,511,080 | A * | 4/1996 | Itoi | G11B 20/10009 341/57 |
| 5,602,868 | A * | 2/1997 | Wilson | H04B 1/40 329/300 |
| 5,706,314 | A | 1/1998 | Davis et al. | |
| 5,949,831 | A | 9/1999 | Coker et al. | |
| 6,118,832 | A | 9/2000 | Mayrargue et al. | |
| 6,158,027 | A | 12/2000 | Bush et al. | |
| 6,580,768 | B1 | 6/2003 | Jaquette | |
| 6,625,235 | B1 | 9/2003 | Coker et al. | |
| 6,643,814 | B1 | 11/2003 | Cideciyan et al. | |
| 6,864,818 | B1 * | 3/2005 | Hezar | H03M 3/396 341/143 |
| 7,477,634 | B1 | 1/2009 | McKown | |
| 7,504,976 | B1 * | 3/2009 | Pellon | H04L 27/36 341/143 |
| 7,593,492 | B1 | 9/2009 | Lande | |
| 7,613,228 | B2 | 11/2009 | Niedzwiecki | |
| 8,630,362 | B1 | 1/2014 | von der Embse | |
| 8,711,988 | B2 | 4/2014 | Chen | |
| 9,201,628 | B2 | 12/2015 | Azadet et al. | |
| 9,735,800 | B2 * | 8/2017 | Pagnanelli | H03M 3/358 |
| 2001/0030996 | A1 * | 10/2001 | Sato | H04B 1/70757 375/152 |
| 2001/0050926 | A1 | 12/2001 | Kumar | |
| 2002/0057735 | A1 | 5/2002 | Piirainen | |
| 2003/0152165 | A1 | 8/2003 | Kondo et al. | |
| 2003/0223505 | A1 | 12/2003 | Verbin et al. | |
| 2004/0169945 | A1 * | 9/2004 | Hiura | G11B 20/10009 360/39 |
| 2004/0204814 | A1 * | 10/2004 | Honda | G01L 23/225 701/111 |
| 2004/0247022 | A1 * | 12/2004 | Raghavan | H04B 3/32 375/219 |
| 2005/0036575 | A1 | 2/2005 | Kuchi et al. | |
| 2005/0046603 | A1 * | 3/2005 | Chang | H04L 25/063 341/155 |
| 2005/0162222 | A1 * | 7/2005 | Hezar | H03F 3/217 330/10 |
| 2006/0029149 | A1 | 2/2006 | Kim et al. | |
| 2006/0109938 | A1 | 5/2006 | Challa et al. | |
| 2006/0271765 | A1 * | 11/2006 | Tell | G06F 9/30036 712/35 |
| 2007/0008200 | A1 * | 1/2007 | Hsieh | H03M 3/38 341/120 |
| 2007/0189402 | A1 | 8/2007 | Yang | |
| 2008/0019422 | A1 | 1/2008 | Smith et al. | |
| 2008/0027720 | A1 | 1/2008 | Kondo et al. | |
| 2008/0212708 | A1 * | 9/2008 | Koslov | H04L 27/0014 375/286 |
| 2008/0253011 | A1 * | 10/2008 | Mouri | G11B 20/10009 360/39 |
| 2008/0316076 | A1 | 12/2008 | Dent et al. | |
| 2009/0116576 | A1 | 5/2009 | Dowling | |
| 2009/0153242 | A1 * | 6/2009 | Cygan | H03F 3/195 330/10 |
| 2009/0164542 | A1 | 6/2009 | Wu et al. | |
| 2009/0225899 | A1 | 9/2009 | Dent | |
| 2010/0158051 | A1 | 6/2010 | Hadzic et al. | |
| 2010/0273427 | A1 | 10/2010 | Mergen et al. | |
| 2010/0316112 | A1 | 12/2010 | Huang et al. | |
| 2011/0007907 | A1 | 1/2011 | Park et al. | |
| 2011/0019724 | A1 | 1/2011 | Agazzi | |
| 2011/0096824 | A1 | 4/2011 | Agazzi et al. | |
| 2012/0087406 | A1 | 4/2012 | Lim et al. | |
| 2012/0106614 | A1 | 5/2012 | Kim et al. | |
| 2012/0188994 | A1 | 7/2012 | Palanki et al. | |
| 2014/0016626 | A1 | 1/2014 | Dai et al. | |
| 2014/0064417 | A1 | 3/2014 | Azadet | |
| 2014/0086367 | A1 | 3/2014 | Azadet et al. | |

OTHER PUBLICATIONS

International Search Report for PCT Patent Application No. PCT/US12/62175, dated Mar. 20, 2013.
International Written Opinion for PCT Patent Application No. PCT/US12/62175, dated Apr. 27, 2014.
Non-Final Office Action for U.S. Appl. No. 14/944,184 dated Mar. 25, 2016, 12 pages.
Non-Final Office Action, dated Nov. 17, 2014, for U.S. Appl. No. 14/090,555.
Notice of Allowance for U.S. Appl. No. 14/944,184 dated Jul. 15, 2016, 7 pages.
Notice of Allowance for U.S. Appl. No. 14/944,184, dated Dec. 2, 2016.
Notice of Allowance, mailed Aug. 12, 2015, for U.S. Appl. No. 14/090,555.
Supplemental Notice of Allowance for U.S. Appl. No. 14/944,184, dated Mar. 28, 2017.

(56) References Cited

OTHER PUBLICATIONS

Supplemental Notice of Allowance for U.S. Appl. No. 14/944,184, dated Mar. 30, 2017.
Goplan, et al., "An Optimization Approach to Single-Bit Quantization", IEEE Transactions on Circuits and Systems—I: Regular Papers, vol. 56, No. 12, Dec. 2009, pp. 2655-2668.
Venkataraman, et al., "An All-Digital Transmitter with a 1-Bit DAC", IEEE Transactions on Communications, vol. 55, No. 10, Oct. 2007, pp. 1951-1962.
Notice of Allowance dated Apr. 12, 2017 for U.S. Appl. No. 14/944,184.

\* cited by examiner

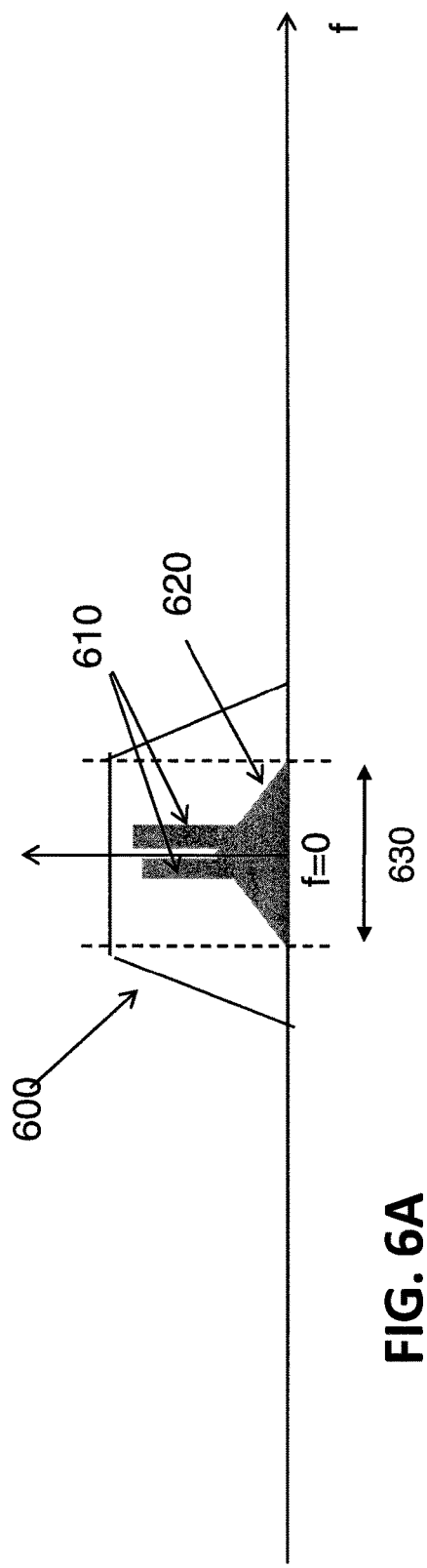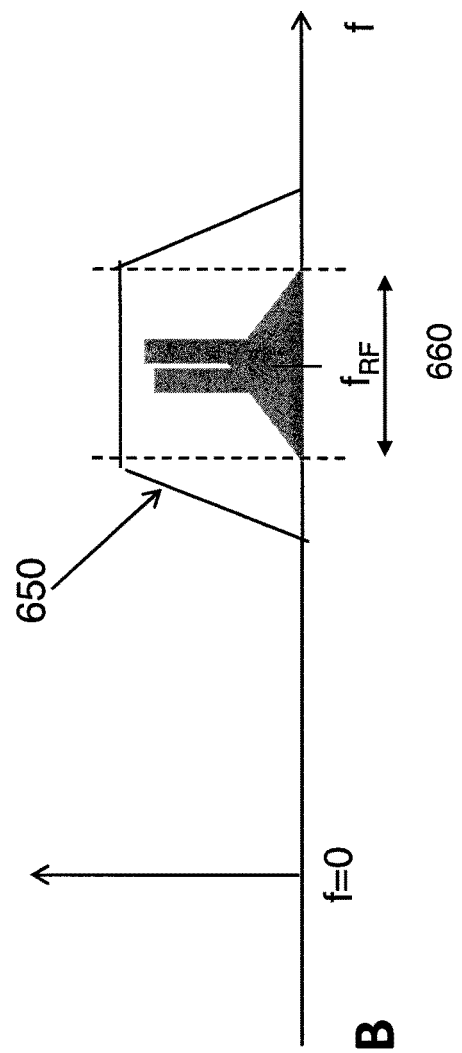
FIG. 6A
FIG. 6B

DIRECT DIGITAL SYNTHESIS OF SIGNALS USING MAXIMUM LIKELIHOOD BIT-STREAM ENCODING

CROSS-REFERENCE TO RELATED APPLICATIONS

The present application is a continuation of U.S. patent application Ser. No. 14/944,184, filed Nov. 17, 2015, and entitled "Direct Digital Synthesis of Signals Using Maximum Likelihood Bit-Stream Encoding" which is a continuation of U.S. patent application Ser. No. 14/090,555, filed Nov. 26, 2013, and entitled "Maximum Likelihood Bit-Stream Generation and Detection Using M-Algorithm and Infinite Impulse Response Filtering", which issued as U.S. Pat. No. 9,201,628 on Mar. 27, 2014 which is a continuation-in-part application of PCT Patent Application Serial No. PCT/US12/62175, filed Oct. 26, 2012, and entitled "Direct Digital Synthesis Of Signals Using Maximum Likelihood Bit-Stream Encoding," which claims priority to U.S. Patent Provisional Application Ser. No. 61/552,242, filed Oct. 27, 2011, entitled "Software Digital Front End (SoftDFE) Signal Processing and Digital Radio," incorporated by reference herein. The present application is related to International Patent Application Serial No. PCT/US09/38929, filed Mar. 31, 2009, entitled "Methods and Apparatus for Direct Synthesis of RF Signals Using Delta-Sigma Modulator," incorporated by reference herein.

FIELD OF THE INVENTION

The present invention is related to digital processing techniques and, more particularly, to techniques for bit stream generation and bit detection using maximum likelihood sequence estimation (MLSE) techniques.

BACKGROUND OF THE INVENTION

Maximum likelihood sequence estimation techniques are often employed to extract useful data out of a noisy data stream. The Viterbi algorithm is one well-known example of an MLSE algorithm that finds a most likely sequence of hidden states that results in a sequence of observed events. The Viterbi algorithm recognizes that when two paths lead into the same state, all future branch metrics of the two paths will be identical. Thus, one path with an inferior cumulative metric can be discarded, and only the superior path need be retained. As the number of filter coefficients increases, however, the number of states grows exponentially.

Thus, reduced complexity MLSE algorithms are often employed to reduce the number of states to consider. For example, the M-Algorithm keeps the M most likely paths (e.g., the paths with the "best path metrics") among those paths that end at the same level of a trellis, and the remaining states are deleted. See, for example, J. B. Anderson, "Limited Search Trellis Decoding of Convolutional Code," IEEE Trans. Inf. Theory, Vol. 35, No. 5, pp. 944-955 (September 1989). At the end of the trellis, the path with the best path metric is selected.

MLSE techniques have been used for both decoding and encoding of signals. MLSE decoding techniques, for example, select a transmitted codeword y that maximizes the probability that a received codeword x was received, given that the transmitted codeword y was sent. PCT Patent Application Serial No. PCT/US12/62175, filed Oct. 26, 2012, and entitled "Direct Digital Synthesis of Signals Using Maximum Likelihood Bit-Stream Encoding," is an example of an MLSE encoding technique that directly synthesizes RF signals using maximum likelihood sequence estimation. While such MLSE techniques have improved the performance of both signal encoding and decoding, a need remains for maximum likelihood bit-stream generation and detection using the M-algorithm and Infinite Impulse Response (IIR) filtering.

SUMMARY OF THE INVENTION

Generally, maximum likelihood bit-stream generation and detection techniques are provided using the M-algorithm and Infinite Impulse Response (IIR) filtering. According to one aspect of the invention, the M-Algorithm is applied to a target input signal X to perform Maximum Likelihood Sequence Estimation on the target input signal X to produce a digital bit stream B, such that after filtering by an IIR filter, the produced digital stream Y produces an error signal satisfying one or more predefined requirements. The predefined requirements comprise, for example, a substantially minimum error.

In an exemplary bit detection implementation of the invention, the target input signal X comprises an observed analog signal and the produced digital stream Y comprises a digitized output of a receive channel corresponding to a transmitted bit stream. In an exemplary bit detection implementation, the BR filter is a model of an analog receive channel that said observed analog signal passed through. The exemplary bit detection techniques can be employed in one or more of a storage device read channel and a data channel.

In an exemplary bit stream generation implementation of the invention, the target input signal X comprises a desired transmit signal and the produced digital stream Y comprises an estimate of the desired transmit signal. In an exemplary bit stream generation implementation, the IIR filter is a model of a transmitter analog output channel that will carry the produced digital stream.

A more complete understanding of the present invention, as well as further features and advantages of the present invention, will be obtained by reference to the following detailed description and drawings.

BRIEF DESCRIPTION OF THE DRAWINGS

FIGS. 6A and 6B illustrate exemplary filter responses for the h(t) prototype filter for a baseband and passband implementation, respectively.

DETAILED DESCRIPTION

Aspects of the present invention provide maximum likelihood bit-stream generation and detection techniques using the M-algorithm and Infinite Impulse Response (IIR) filtering. According to one aspect of the invention, the M-Algorithm is applied to a target input signal X to perform Maximum Likelihood Sequence Estimation on the target input signal X to produce a digital bit stream B, such that after filtering by an IIR filter, the produced digital stream Y produces an error signal satisfying one or more predefined requirements. In an exemplary bit detection implementation of the invention, the target input signal X comprises an observed analog signal and the produced digital stream Y comprises a digitized output of a receive channel corresponding to a transmitted bit stream. In an exemplary bit stream generation implementation of the invention, the target input signal X comprises a desired transmit signal and the produced digital stream Y comprises an estimate of the desired transmit signal.

Delta-Sigma Modulation

Figure 1:
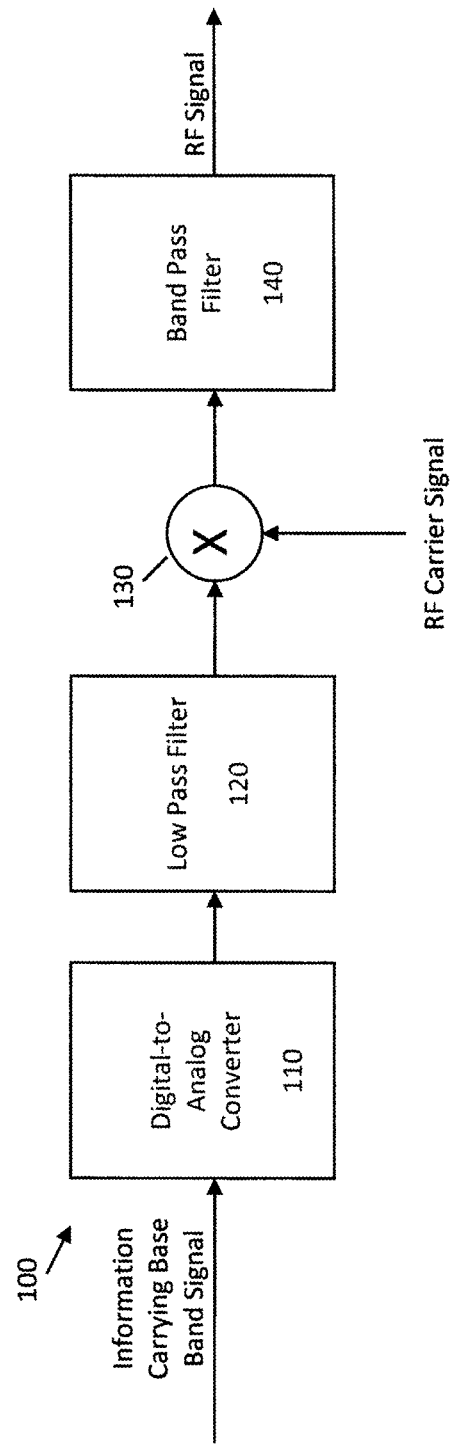
FIG. 1 illustrates a conventional RF transmitter.

FIG. 1 illustrates a conventional RF transmitter 100. As shown in FIG. 1, the conventional RF transmitter 100 initially converts the information carrying base band signal to a digital signal using a digital-to-analog converter 110. The digital signal is then filtered by a low pass filter 120 and mixed with an RF carrier frequency signal using a mixer 130. The output of the mixer 130 is then filtered by a band pass filter 140 to reduce the out-of-band noise, in a known manner.

Figure 2:
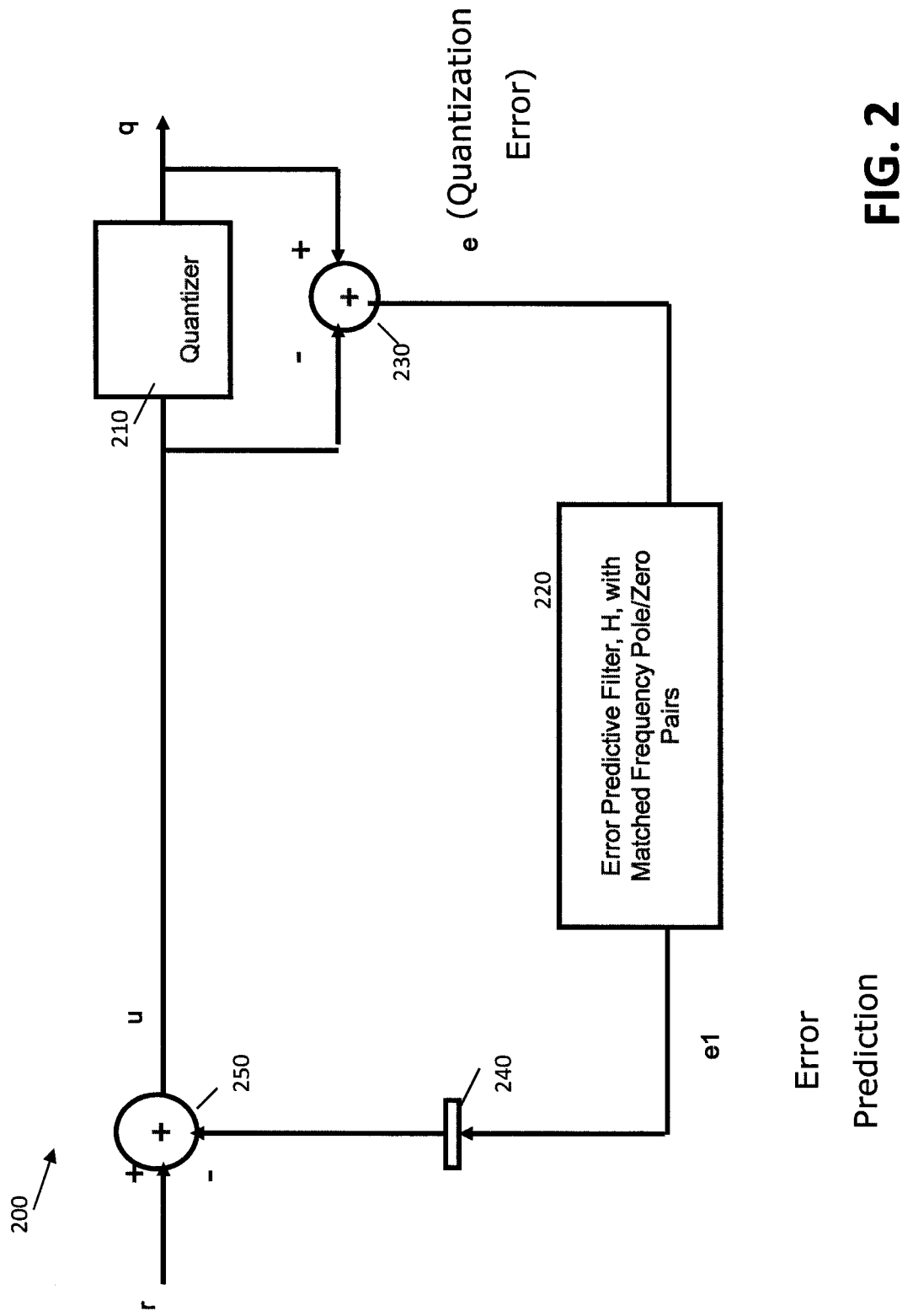
FIG. 2 illustrates an exemplary delta-sigma modulator.

FIG. 2 illustrates an exemplary delta-sigma modulator 200 in accordance with International Patent Application Serial No. PCT/US09/38929, filed Mar. 31, 2009, entitled "Methods and Apparatus for Direct Synthesis of RF Signals Using Delta-Sigma Modulator." As shown in FIG. 2, the exemplary delta-sigma modulator 200 employs a one bit quantizer 210 and an error predictive filter 220 with matched frequency pole/zero pairs. The matched frequency pole/zero pairs are discussed further below in conjunction with Equation (2). The exemplary error predictive filter 220 has an order of 18.

The input value, u, to the one bit quantizer 210 is compared to the quantized output value, q, by an adder 230 that generates a quantization error, e. The quantization error, e, is processed by the error predictive filter 220 to generate an error prediction value, el, that is stored in a register 240 for one clock cycle and then subtracted from the input signal, r, by an adder 250 that generates the error-compensated input value, u. Generally, error predictive filters 220 employ some knowledge of the input signal to filter the signal, in a known manner. For example, if the error is known to be slowly varying, the error predictive filter 220 can use the same value for subsequent samples.

Generally, the output of the one bit quantizer 210 provides a coarse approximation of the input signal. The input signal, r, may be, for example, a 16 bit digital value, and the one bit quantization performed by the quantizer 210 (e.g., the quantization can be based on the polarity of the input signal) for a coarse analog conversion. The quantization noise, e, associated with the one bit quantizer 210 is primarily out-of-band. As previously indicated, the one bit quantization performed by the quantizer 210 is inherently linear.

In the exemplary embodiment described herein, the quantization error, e(n), is assumed to be uncorrelated to the input, r(n). Thus, the power spectral density, $S_{q,q}$, of the quantizer output, q(t), can be expressed a function of the frequency, f, as follows:

$$S_{q,q}(f) = S_{r,r}(f) + (1-H(z))^2 S_{e,e}(f)$$

where r is the input signal and $$z = e^2 j\pi \frac{f}{Fs}$$

T error predictive filter 220 provides zeroes at desired frequencies of $f_1, f_2, \ldots f_N$, and provides poles at substantially the same frequencies as the zeroes, with the poles having magnitude values, $.\alpha_i$, less than one. It is noted that the placement of the poles and zeros may be fixed or variable and may be optimized for a given implementation, as would be apparent to a person of ordinary skill in the art.

Figure 3:
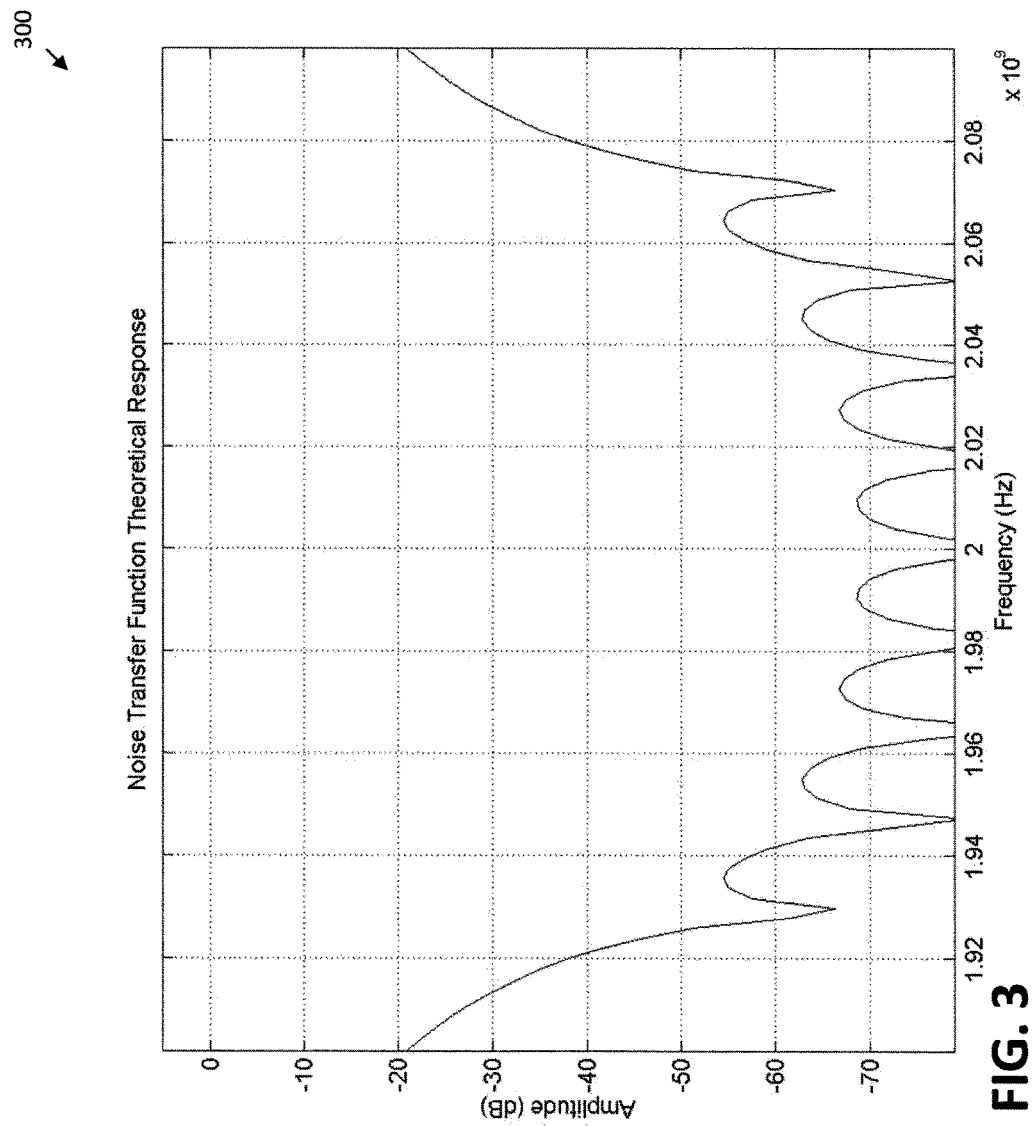
FIG. 3 illustrates a frequency response for an exemplary one bit delta-sigma modulator.

FIG. 3 illustrates a frequency response 300 for an exemplary passband delta-sigma modulator 200 having an order of 18. As shown in FIG. 3, the exemplary error predictive filter 220 exhibits a passband around 2 GHz and has a bandwidth of 100 MHz. Significantly, the exemplary error predictive filter 220 demonstrates an SFDR of 110 dB.

Direct Synthesis Using Maximum Likelihood Bit-Stream Encoding

Figure 4:
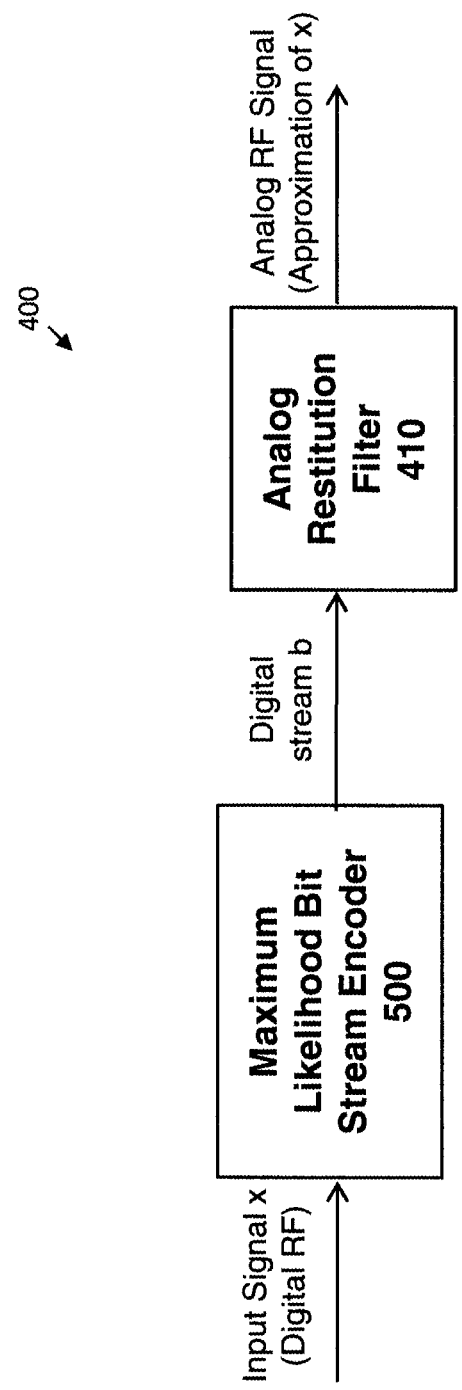
FIG. 4 is a schematic block diagram of an exemplary maximum likelihood bit-stream encoding system incorporating aspects of the present invention.

FIG. 4 is a schematic block diagram of an exemplary maximum likelihood bit-stream encoding system 400 incorporating aspects of the present invention. As shown in FIG. 4, the maximum likelihood bit-stream encoding system 400 comprises a maximum likelihood bit-stream encoder 500, discussed further below in conjunction with FIG. 5, and an analog restitution filter 410. An input signal x is applied to the maximum likelihood bit-stream encoder 500. The input signal x comprises a digital RF signal.

As discussed further below in conjunction with FIG. 5, the maximum likelihood bit-stream encoder 500 produces a digital stream b that is substantially equal to the digital RF input signal x such that after filtering by a prototype filter the produced digital stream b produces a substantially minimum error. As discussed below, the error is defined as a difference between the digital output of the prototype filter and the digital RF input signal x.

The digital stream b can be, for example, a two-level binary signal, a multi-level signal, as well as one or more of NRZ, PAM, QAM (e.g., QPSK) signals.

As shown in FIG. 4, the digital stream b is applied to an analog restitution filter 410 to generate an analog RF signal that approximates the digital RF input signal x. The analog restitution filter 410 is typically passive and may be embodied, for example, using resistive-inductive-capacitive (R-L-C) circuits and/or transmission lines.

Aspects of the present invention recognize that maximum likelihood sequence estimation (MLSE) techniques can be applied to data conversion and encoding, and not just the more typical data decoding.

Figure 5:
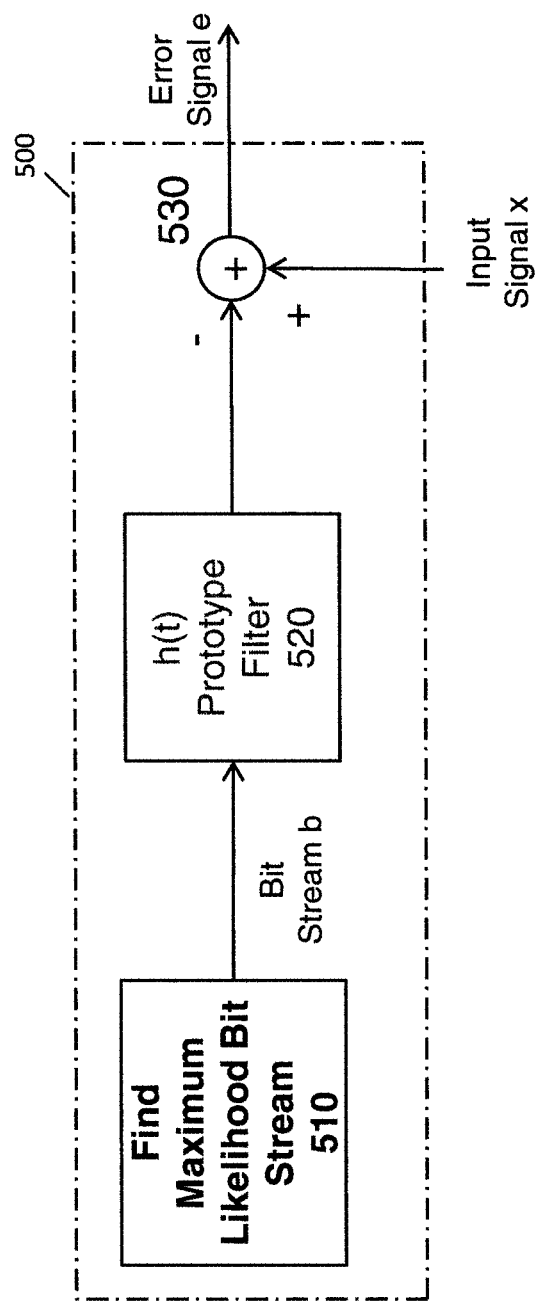
FIG. 5 is a schematic block diagram of an exemplary implementation of the maximum likelihood bit-stream encoder of FIG. 4.

FIG. 5 is a schematic block diagram of an exemplary maximum likelihood bit-stream encoder 500 incorporating aspects of the present invention. As shown in FIG. 5, the maximum likelihood bit-stream encoder 500 receives a digital RF input signal x and produces a digital stream b that is substantially equal to the digital RF input signal x such that after filtering by a h(t) prototype filter 520, discussed further below in conjunction with FIG. 6, the produced digital stream b produces a substantially minimum error e. As shown in FIG. 5, the exemplary error signal e is obtained by an adder 530 as a difference between the digital output of the prototype filter 520 (filtered digital bit-stream b) and the digital RF input signal x.

Generally, the h(t) prototype filter 520 has a passband that is substantially centered around the frequency of the digital input signal x. The h(t) prototype filter 520 can be implemented, for example, as a finite impulse response (FIR) or an infinite impulse response (IIR) filter.

At stage 510, the maximum likelihood bit-stream encoder 500 finds the maximum likelihood bit stream (bit stream b) that minimizes the error e using maximum likelihood sequence estimation (MLSE) techniques. The MSLE techniques comprise, for example, one or more of a Viterbi algorithm, Reduced State Sequence Estimation (RSSE) and an M algorithm (to reduce number of states of the decoder which can be large). If the number of taps is Ntaps, the number of states of decoder is $2^{-Ntaps}$ grows exponentially with number of taps and may not be practical. For a discussion of the M algorithm, see, for example, E. F. Haratsch, "High-Speed VLSI Implementation of Reduced Complexity Sequence Estimation Algorithms With Application to Gigabit Ethernet 1000 BaseT," Intl Symposium on VLSI Technology, Systems, and Applications, Taipei (Jun. 1999), incorporated by reference herein.

The analog restitution filter 410 is designed based on the characteristics of the input signal x and the prototype filter 520 has a frequency response that is similar to the restitution filter 410.

The MLSE optionally incorporates in its decoding the non-linear memory of an RF power amplifier (Class S switching-type amplifier) or digital driver analog circuit (e.g., the transmit circuit of a serializer-deserializer (SerDes) commonly used in digital or mixed signal System on a Chip (SOC)) to compensate for the non-linearity of these devices. The System on a Chip may comprise, for example, a baseband signal processor, a digital front end (DFE) or a single chip base station.

FIGS. 6A and 6B illustrate exemplary filter responses for the h(t) prototype filter 620 for a baseband and passband implementation, respectively. As shown in FIG. 6A, the h(t) baseband prototype filter 620 has a baseband response 610 (2 carriers of 20 MHz LTE), such as, e.g., a 40 MHz LTE baseband signal. The exemplary corresponding sampling rate is 5.89824 GSPS(=30.62 MSPS (LTE baseband)). The response portion 620 is attributable to spectral re-growth due to digital pre-distortion (DPD). The signal bandwidth of interest 630 is, e.g., 120 MHz after DPD up to 3rd order correction (or 200 MHz for $5^{th}$ order correction).

As shown in FIG. 6B, the h(t) passband prototype filter 620 has a passband response 650 and a signal bandwidth of interest 660. In the passband case, a too small signal bandwidth is difficult to realize as it results in a very high Q filter (e.g., 2.14 GHz/20 MHz Q 100 (too high), however 2.14 GHz/200 MHz results in Q of 10 which is practical).

In a further variation, a maximum likelihood encoder can also be used as an analog to digital converter, where the input signal is an analog signal instead of a digital signal, the prototype filter is analog, the restitution filter is digital and the maximum likelihood decoder is implemented in the analog domain.

FIR Bit Stream Generation or Detection

As indicated above, aspects of the present invention apply an M-Algorithm to a target input signal X to perform Maximum Likelihood Sequence Estimation on the target input signal X to produce a digital bit stream B, such that after filtering by an Infinite Impulse Response (IIR) filter, the produced digital stream Y produces an error signal satisfying one or more predefined requirements. In an exemplary bit detection implementation of the invention, the target input signal X comprises an observed analog signal and said produced digital stream Y comprises a digitized output of a receive channel corresponding to a transmitted bit stream. In an exemplary bit stream generation implementation of the invention, the target input signal X comprises a desired transmit signal and said produced digital stream Y comprises an estimate of said desired transmit signal.

A Finite Impulse Response (FIR) filter has the form:

$$Y_n = b_0 x_n + b_1 x_n - 1 + \ldots b_L x_n - L$$

where $Y_n$ is the output at time step n in terms of the current input $x_n$ and past inputs $x_{n-i}$. The coefficients $b_i$ define the filter.

In an exemplary implementation, the target output sequence $\{Dn\}$ at each time is known, and the input stream $\{xi\}$ that will result in outputs $\{Yn\}$ as close as possible to the target $D_n$ are to be determined. In the case of bit stream generation, the target sequence $\{D_n\}$ is the desired transmit output signal. In the case of bit stream detection, the target sequence $\{D_n\}$ is the (digitized) observed output of the receive channel. With reference to FIG. 5, the target output sequence $\{D_n\}$ corresponds to the input signal x; the input stream $\{x_i\}$ corresponds to bit stream b and the outputs $\{Y_n\}$ are the samples at the output of the prototype filter 520.

Thus, $x_i$ comprises a binary digital bit-stream, each having a possible value of either +1 or −1, and the coefficients $b_i$ are based upon a combination of the channel characteristics that will shape the bit-stream as it is converted from digital to analog, together with any analog filtering that is done to the signal before it is to be compared with the target analog sample values $D_n$. The coefficients might typically be 16 bit integer values. In the case of bit stream generation, the channel characteristics are those of the transmit path. In the case of bit stream detection, the channel characteristics are those of the receive path.

One approach to this problem is to use a Viterbi algorithm. At each time n, there is a current state, consisting of the past values $(x_{n-1}, \ldots, x_{n-L})$ in the filter delay line, and a sequence of desired outputs $D_k$. The next value $x_n$, is desired that will give the output $Y_n$ and then advance the state to the new state $x_n, \ldots, x_{n-L+1}$. There are 2 L possible states to consider. In the Viterbi algorithm, each of the 2 L states are examined, computing metrics based upon which of two possible past states each current state could have come from, $(x_{n-L}=+1$ or −1) and which of two possible states each state could branch to $(x_n=+1$ or −1). The branch metric is given by $(Y_n-D_n)^2$, and the cumulative metric for a path is the sum of the branch metrics over time for that path.

The main step in the Viterbi algorithm for the FIR filter with binary inputs is the butterfly operation. In the transition from filter delay line $(x_{n-1}, \ldots, x_{n-L})$ to $(x_n, \ldots, x_{n-L}+1)$, it is observed that state $(x_n, \ldots, x_{n-L}+1)$ can come from either one of two states: $(x_{n-1}, \ldots, x_{n-L+1}, +1)$ or $(x_{n-1}, \ldots, x_{n-L+1}, -1)$. Each of these states has a path metric associated with it, consisting of the sum of the branch metrics up to time n−1. It is also observed that each of the states $(x_{n-1}, \ldots, x_{n-L+1}, \pm 1)$ can lead to either of the two states $(\pm 1, x_{n-1}, \ldots, x_{n-L+1})$. This gives a butterfly of four possible transitions. The new path metric is computed by adding the branch metric $(Y_n-D_n)^2$ to the cumulative metric for the path leading into the new state. The key feature of the Viterbi algorithm is the observation that when two paths lead into the same state, all future branch metrics of the two paths will be identical, only the cumulative value leading up to that point will differ. This means that the path with the worse cumulative metric can be discarded, and only the superior path retained, from that point on, with no loss of optimality. Note that this is only possible because we examine all the states.

As the number of filter coefficients increases, the number of states grows exponentially—there are 2 L states, and for a filter with, for example, 128 coefficients, 2 128 is a very large number. In practice, then, in such a situation, another algorithm must be used to reduce the number of states to consider. One example is referred to as the M-Algorithm, as described, for example, in J. B. Anderson, "Limited Search Trellis Decoding of Convolutional Code," IEEE Trans. Inf. Theory, Vol. 35, No. 5, pp. 944-955 (Sep. 1989), incorporated by reference herein. When the M-Algorithm starts, the number of states doubles with each time step: $x_0=\pm1$ or $-1$ (2 states); $X_1=+1$ or $-1$ (now 4 combinations of ($x_0, x_1$)), etc. With the M-Algorithm, the number of states grows only to a certain specified number, s, for example, M states. Then at the next stage, when the number of states doubles to 2M, the best M of the 2M states are retained and the others are deleted. The same procedure is followed for all subsequent steps.

There are two consequences. The first consequence is a smaller, more manageable number of states. The second consequence is that since all the states are no longer retained, you can no longer look backward to compare the paths that lead to each of the current states (the required information won't be there). Instead of comparing two paths that lead to the same state and deleting the worst one, the M-Algorithm instead compares 2M paths leading forward, and deletes half of them. Since they are not converging into the same state, however, the deletion is performed based on incomplete information. Thus, in addition to changing the nature of the computation, there are suboptimal solutions, because paths are deleted based on incomplete information.

IIR Bit Stream Generation or Detection

Consider an Infinite Impulse Response (IIR) filter, having the form:

$$Y_n = a_1 Y_{n-1} + \ldots a_K Y_{n-K} + b_0 x_n + b_1 x_{n-1} + \ldots + b_L x_{n-L}$$

In the case of an IIR filter, the output $Y_n$ of the filter depends on the past inputs and current inputs, and also on the past outputs. An advantage of the IIR filter is that a much smaller number of coefficients can typically be used to achieve a similar level of filter complexity. The IIR filter has an infinite impulse response. To create such a response with an FIR filter would require an infinite number of coefficients.

The state of an IIR filter is given by ($x_{n-1}, \ldots, x_{n-L}, Y_{n-1}, \ldots, Y_{n-K}$). It is noted that while the $x_i$ are +1 or $-1$, the $Y_i$ are typically 16 bit values for exemplary applications. Thus, the smaller number of coefficients does not really translate into a smaller number of states. For example, for an FIR filter with L=136 coefficients, there would be 2 136 states. An IIR filter can be designed with, for example, L=8 numerator taps and K=8 denominator taps, so the state would have eight x values and eight Y values. While the x values contribute a factor of 2 8 states, however, the Y values, each being 16 bits, contribute 2 (16*8) values. Thus, the resulting number of states becomes 2 (8+16*8)=2 136, the same as the apparently more complex FIR filter. Thus, a full Viterbi algorithm is still impractical for such a filter. Also, the butterfly operation is more complicated, because there is no longer a simple trellis in which any given state can come from only two possible previous states. Note that a full Viterbi algorithm for an IIR convolutional encoder is feasible and is in common use. In this case, the $Y_i$ are also one bit values, taking values of only +1 or $-1$.

M-Algorithm Using IIR

Aspects of the present invention apply the M-algorithm to an IIR filter, in the case where the $Y_i$ are not binary values. While the Viterbi algorithm is difficult to implement for such an IIR filter, when the M-algorithm is applied to the IIR filter, the above-described methods used for the FIR filter can be employed. With the M-algorithm, you no longer look back to the previous state, where the Viterbi becomes very difficult for the IIR filter (since the Viterbi algorithm retains all possible states). The look forward to the next state, however, is easier, and is similar to the FIR.

Figure 7A:
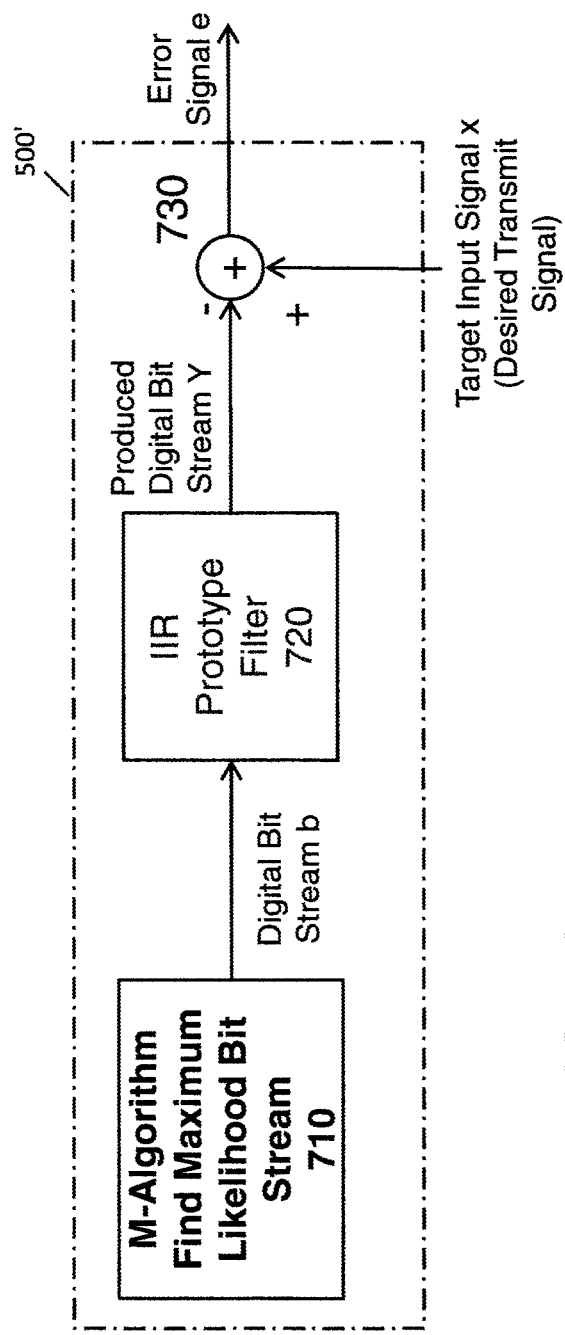
FIGS. 7A and 7B are schematic block diagrams of an exemplary alternate maximum likelihood bit-stream generator incorporating transmitter (encoding) and bit detection aspects of the present invention, respectively.

FIG. 7A is a schematic block diagram of an exemplary alternate maximum likelihood bit-stream generator 500' incorporating transmitter aspects of the present invention. Generally, the exemplary alternate maximum likelihood bit-stream generator 500' of FIG. 7A generates a bit stream b that causes a desired output. As shown in FIG. 7A, the alternate exemplary maximum likelihood bit-stream generator 500' receives a digital RF input signal x corresponding to a desired signal to be transmitted and employs the M-Algorithm 710 to produce a digital stream b that is substantially equal to the desired digital RF input signal x such that after filtering by an Infinite Impulse Response (IIR) prototype filter 720, the produced digital stream Y produces a substantially minimum error e. As shown in FIG. 7A, the exemplary error signal e is obtained by an adder 730 as a difference between the multi-bit digital output Y of the IIR prototype filter 720 (filtered digital bit-stream b) and the desired digital RF input signal x. Generally, the IIR prototype filter 720 has a passband that is substantially centered around the frequency of the digital input signal x.

At stage 710, the M-Algorithm 710 finds the maximum likelihood bit stream (bit stream b) that minimizes the error e. The analog restitution filter 410 (FIG. 4) is designed based on the characteristics of the input signal x and the IIR prototype filter 720 has a frequency response that is similar to the restitution filter 410.

The M-Algorithm MLSE 710 optionally incorporates in its decoding the non-linear memory of an RF power amplifier (Class S switching-type amplifier) or digital driver analog circuit (e.g., the transmit circuit of a serializer-deserializer (SerDes) commonly used in digital or mixed signal System on a Chip (SOC)) (for the transmitter application) to compensate for the non-linearity of these devices. To add non-linear memory, the IIR model described above would be enhanced to add additional terms. For a relatively straight forward example, nonlinearity can be introduced into the IIR model by adding terms of the form $b_{ij} x_{n-i} x_{n-j}$, i.e., containing not just terms linear in the $x_{n-i}$ but nonlinear combinations as well (i.e., products of them). (Here, since the $x_i$ are binary values, only cross products must be processed). The System on a Chip may comprise, for example, a baseband signal processor, a digital front end (DFE) or a single chip base station.

The state of the IIR filter 720 (having a memory length equal to K) comprises both the $x_i$ and the $Y_i$ values. The state transition going forward (according to equation (3)) looks like:

$$(x_{n-1}, \ldots, x_{n-L}, Y_{n-1}, \ldots, Y_{n-K}) \to (x_n, \ldots, x_{n-L+1}, Y_n, \ldots, Y_{n-K+1}), via:$$

$$(x_{n-1}, \ldots, x_{n-L}, Y_{n-1}, \ldots, Y_{n-K}) \to (+1, x_{n-1}, \ldots, x_{n-L+1}, Y(1, x_{n-1}, \ldots, x_{n-L}, Y_{n-1}, \ldots, Y_{n-K}), Y_{n-1}, \ldots, Y_{n-K+1}), \text{ or}$$

$$(x_{n-1}, \ldots, x_{n-L}, Y_{n-1}, \ldots, Y_{n-K}) \to (-1, x_{n-1}, \ldots, x_{n-L+1}, Y(-1, x_{n-1}, \ldots, x_{n-L}, Y_{n-1}, \ldots, Y_{n-K}), Y_{n-1}, \ldots, Y_{n-K+1}).$$

While it would be complicated to unravel this for the backward looking half of the butterfly, the forward transitions used in the M-algorithm are similar to that for the FIR.

The same procedure is followed of increasing the number of states by a factor of two with each choice of +1 or $-1$ for each $x_i$ input. When M states are reached, only the M best of the 2M states generated by the next choice are retained. When considering how large M must be, consider that a fraction is taken of a larger number of possible states than would be indicated by just the number of taps, that is, 2 (8+16*8), not 2 8. Thus, the value of M needed for each of the two examples given, each having 2 136 possible states, would likely be similar.

Computational complexity for the two techniques is comparable as well. For the example comparison above, it can be shown that the number of adders required to construct the multipliers needed looks like:

FIR: 136 taps*1 bit*16 bit=136*16=2176 adders.

IIR: 8 taps*1 bit*16 bit+8 taps*16 bit*16 bit=128+ 8*256=2176 adders.

Thus, the implementation complexity for these two filters is similar. The advantage that is gained is the increase in the available choices of filters that can be used to try to construct a bit-stream generator having desired performance characteristics. Instead of being limited to FIR designs, now the design space of the IIR filters is also available.

Figure 7B:
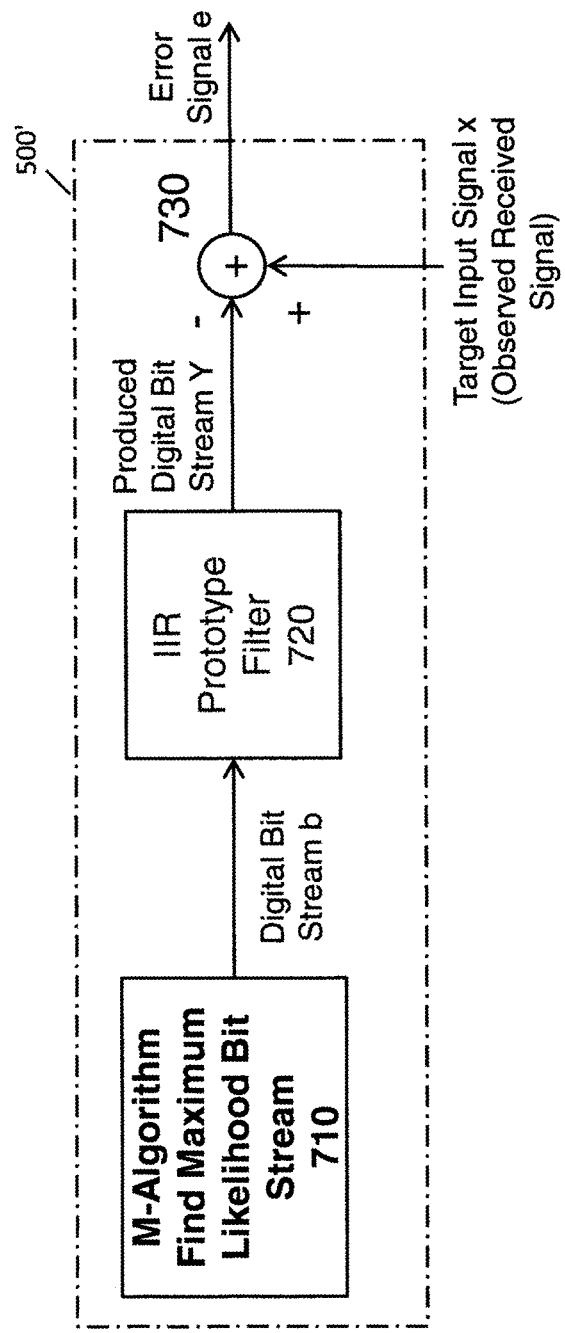

FIG. 7B is a schematic block diagram of an exemplary alternate maximum likelihood bit-stream generator 500' incorporating bit detection aspects of the present invention. Generally, the exemplary alternate maximum likelihood bit-stream generator 500' of FIG. 7B finds a bit stream that caused an observed output. As shown in FIG. 7B, the alternate exemplary maximum likelihood bit-stream generator 500' receives a digital input signal x corresponding to an observed received signal and employs the M-Algorithm 710 to produce a digital stream b that is substantially equal to the transmitted bit stream that caused the observed output, such that after filtering by the IIR filter 720, the produced digital stream b produces a substantially minimum error e.

The exemplary alternate maximum likelihood bit-stream generator 500' can be employed, for example, for bit detection in a data communications channel or when reading data stored on a memory device (such as a hard drive) with a read channel sensing circuit.

In the implementation of FIG. 7A, the filter 720 is a model of the transmitter analog output channel that the desired bits will go through. In the implementation of FIG. 7B, the filter 720 is a model of the analog receive channel (data channel or storage device read channel) that the observed bits have passed through.

Among other benefits of the present invention, the disclosed IIR approach provides the ability to try filters with an Infinite Impulse Response and the disclosed 11R methods provide similar orders of magnitude of complexity.

CONCLUSION

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

What is claimed is:

1. An apparatus comprising:
 a passband filter having a passband centered around a frequency of a target input signal;
 circuitry coupled to the passband filter, wherein the circuitry is to generate a multi-level digital stream as input to the passband filter and
 a switching type power amplifier coupled to the passband filter,
 wherein the circuitry comprises logic that implements one of: Viterbi scheme, reduces state sequence estimation scheme, or M-algorithm, and
 wherein the target input signal comprises a digital Radio Frequency (RF) signal.

2. The apparatus of claim 1, wherein the multi-level signal is one of:
 binary signal, NRZ signal, PAM signal, or QAM signal.

3. The apparatus of claim 2, wherein passband filter is one of a finite impulse response (FIR) filter or an infinite impulse response (IIR) filter.

4. The apparatus of claim 1, wherein the circuitry is a first circuitry and wherein the apparatus comprises a second circuitry coupled to the passband filter, wherein the second circuitry is to determine a difference between an output of the passband filter and the target input signal, and wherein an output of the second circuitry is an error signal.

5. The apparatus of claim 1 comprises a digital-to-analog converter (DAC) to convert an output of the passband filter to an analog representation.

6. The apparatus of claim 5, wherein the DAC is part of a transmitter of a serializer-deserializer in a system-on-chip (SOC).

7. A method comprising:
 centering a passband filter around a frequency of a target input signal;
 generating a multi-level digital stream as input to the passband filter, wherein generating the multi-level signal comprises implementing one of: Viterbi scheme, reduces state sequence estimation scheme, or M-algorithm; and
 coupling the passband filter with a switching type amplifier,
 wherein the target input signal comprises a digital Radio Frequency (RF) signal.

8. The method of claim 7, wherein the multi-level signal is one of:
 binary signal, NRZ signal, PAM signal, or QAM signal.

9. The method of claim 7 comprises determining a difference between an output of the passband and the target input signal.

10. The method of claim 7 comprises converting an output of the passband to an analog representation.

11. A system comprising:
an Radio Frequency (RF) power amplifier having non-linear memory;
a baseband signal processor comprising:
a passband filter having a passband centered around a frequency of a target input signal; and
circuitry coupled to the passband filter, wherein the circuitry is to generate a multi-level digital stream as input to the passband filter and
a switching type power amplifier coupled to the passband filter,
wherein the circuitry comprises logic that implements one of: Viterbi scheme, reduces state sequence estimation scheme, or M-algorithm, and
wherein the target input signal comprises a digital RF signal.

12. The system of claim 11, wherein the RF power amplifier is a Class S switching-type amplifier.

13. The system of claim 11, wherein the circuitry is a first circuitry, and wherein the apparatus comprises a second circuitry coupled to the passband filter, wherein the second circuitry is to determine a difference between an output of the passband filter and the target input signal, and wherein an output of the second circuitry is an error signal.

14. The system of claim 11, wherein the passband filter has a Q of 10.

\* \* \* \* \*